United States Patent [19]

Coleman et al.

[11] Patent Number: 4,922,312

[45] Date of Patent: May 1, 1990

[54] DRAM PROCESS WITH IMPROVED POLYSILICON-TO-POLYSILICON CAPACITOR AND THE CAPACITOR

[75] Inventors: Donald J. Coleman, Plano; Roger A. Haken, Richardson, both of Tex.

[73] Assignee: Texas Instruments Incorporated, Dallas, Tex.

[21] Appl. No.: 172,995

[22] Filed: Mar. 28, 1988

Related U.S. Application Data

[63] Continuation of Ser. No. 858,850, Apr. 30, 1986, which is a continuation of Ser. No. 468,921, Feb. 23, 1983, abandoned.

[51] Int. Cl.⁵ .................................... H01L 29/78
[52] U.S. Cl. ...................... 357/23.6; 357/54
[58] Field of Search ...................... 357/23.6, 54

[56] References Cited

U.S. PATENT DOCUMENTS

| 4,213,139 | 7/1980 | Rao | 357/45 |
| 4,224,635 | 9/1980 | Mauthe | 365/149 |
| 4,355,374 | 10/1982 | Sakai et al. | 357/14 |
| 4,455,568 | 6/1984 | Shiota | 357/54 |

FOREIGN PATENT DOCUMENTS 2038085 7/1980 United Kingdom ............... 365/149

OTHER PUBLICATIONS

Koyanagi et al., "Novel High Density, Stacked Capacitor MOS RAM," *Proc. of the 10th Conf. on Solid State Devices*, Tokyo, 1978; *Jap. J. of Appl. Phys.*, vol. 18, (1979), Suppl. 18-1, pp. 35-42.

Tolley et al., "72-K RAM Stands Up to Hard and Soft Errors," *Electronics*, Jun. 16, 1982, pp. 147-151.

Jolly et al., "A Dynamic RAM Cell in Recrystallized Polysilicon," *IEEE Elec. Device Letters*, vol. EDL-4, No. 1, 1/83, pp. 8-11.

Heald et al., "Multilevel Random-Access Memory Using One Trans. Per Cell," IEEE J. of S.S. Circuits, vol. SC-11, No. 4, Aug. 1976, pp. 519-527.

*Primary Examiner*—Martin H. Edlow
*Attorney, Agent, or Firm*—Thomas W. DeMond; James T. Comfort; Melvin Sharp

[57] ABSTRACT

The present invention teaches a new method for fabrication of DRAM cells having an upper capacitor plate over the polysilicon storage gate. To provide a very high specific capacitance and very good integrity between the first polysilicon storage gate and the (second or third polysilicon) upper capacitor plate, the dielectric is formed as an oxide/nitride composite which is then reoxidized. This provides the advantages of high dielectric integrity, high specific capacitance, uniformity and reproducibility.

13 Claims, 2 Drawing Sheets

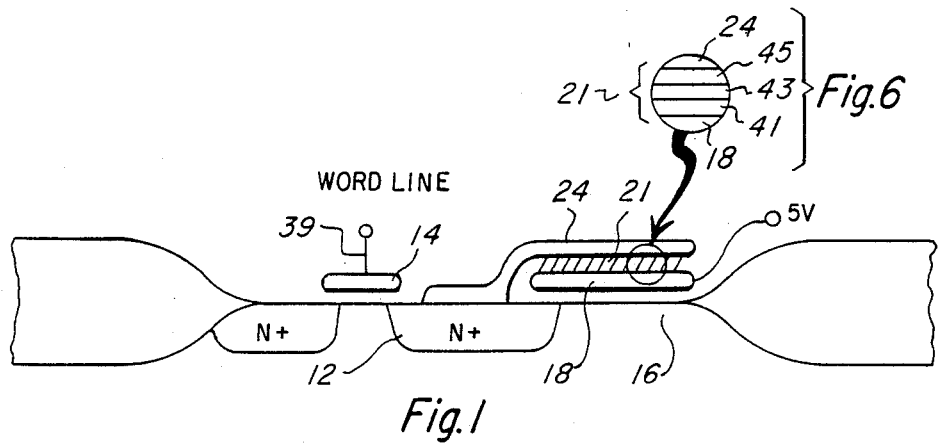
Fig. 1
Fig. 6
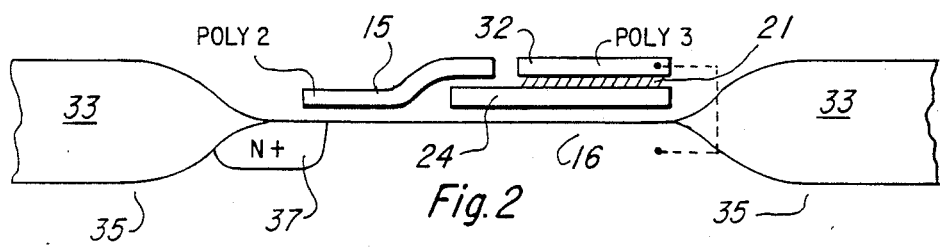
Fig. 2
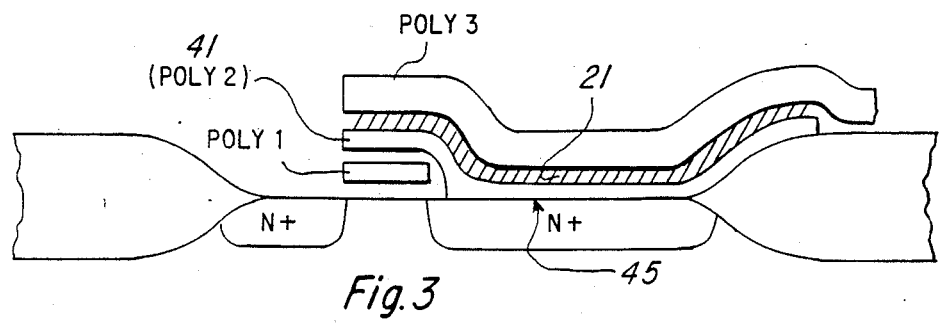
Fig. 3
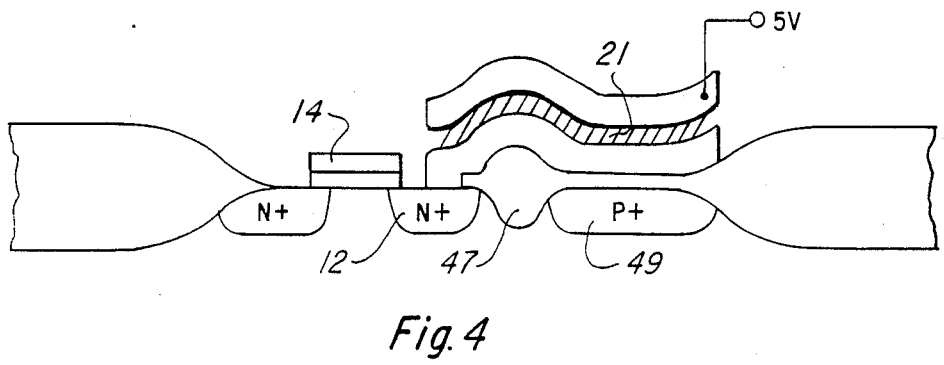
Fig. 4

DRAM PROCESS WITH IMPROVED POLYSILICON-TO-POLYSILICON CAPACITOR AND THE CAPACITOR

This application is a continuation of application Ser. No. 858,850, filed Apr. 30, 1986 which is a continuation of Ser. No. 468,921 filed Feb. 23, 1983, now abandoned.

BACKGROUND AND SUMMARY OF THE INVENTION

The present invention relates to a method for fabricating DRAM cells.

There is great pressure to scale dynamic ram cells to ever higher densities. However, as the conventional (single transistor single capacitor) DRAM cell is scaled to higher densities (e.g. beyond 64K), it is important that the storage capacitance of the cell not be scaled. That is, if the charge in the storage capacitor in the DRAM cell becomes less then around 250 Femtocoulombs, the exposure to alpha particle-induced errors becomes disastrously large. Since substantial capacitative loading from the access lines on the chip is inevitable, the number of electrons stored in the cell is already near the practical limits permitted by sense amplifier operation. Only incremental improvement in this respect can be anticipated. Therefore, the number of electrons stored in a DRAM cell must be relatively high. However, unless operating voltages are to be increased (which seems extremely unlikly), this unscalable limitation on the amount of stored charge imposes an unscalable limitation on the capacitance of the storage gate. If the storage capacitance is fixed and unscalable, then the only parameter which can be varied to achieve physically smaller storage gates is the specific capacitance of the storage gate capacitor. Unless the physical size of the storage gate can be reduced while maintaining the same capacitance level, scaling of the conventional DRAM cell to one megabit and beyond will certainly be very difficult, and may be completely uneconomical.

Thus it is an object of the present invention to provide a DRAM cell having a very high specific capacitance on the storage gate.

It is a further object of the present invention to provide a DRAM cell having a storage gate with a capacitance of at least 50 femtofarads at a voltage of five volts, wherein the storage gate has an area of less than 12 square microns.

One approach which has been proposed to provide higher specific capacitance on the storage gate on DRAMS is to provide an upper storage capacitor for the DRAM cell. That is, over the storage gate (e.g., in first polycrystalline silicon (polysilicon) is provided an upper conductive layer, which defines at least part of the storage capacitance. This approach can be performed using a second polysilicon (polysilicon/silicide composite) or a third polysilicon (polysilicon/silicide composite) upper plate for the storage capacitor. In either case, it is preferable to also be able to use the second (or third) polysilicon level for transistors in the peripheral circuits, and therefore a regrown gate oxide is preferably used for such transistors. However, the formation of such a regrown gate oxide is likely to cause uncontrolled increase in the thickness of the dielectric layer over the first polysilicon storage gate, in prior art methods.

In prior art methods of forming a dielectric over a polysilicon level, the equivalent dielectric thickness of the layer over the first polysilicon storage gate may be rather high, due to this thickness increase.

Thus it is an object of the present invention to provide a DRAM cell having a very thin dielectric over a polysilicon storage capacitor bottom plate.

The asperity of polysilicon presents a significant difficulty. In particular, increased doping of the polysilicon tends to produce more asperity, and increased thickness of the polysilicon also tends to produce more asperity. A recent paper has indicated that many asperities are generated during the thermal oxidation process, and are not found in the topography of the As-doped polysilicon. See Marais et al. "Polysilicon/silicon dioxide Interface Microtexture and Dielectric Breakdown," Journal of the Electrochemical Society, Volume 129, Page 1282 (1982), which is hereby incorporated by reference. The As-doped poly has "hard spots" which are resistant to oxidation. These hard spots will generate inclusions and protuberances during the oxidation process.

Thus it is a further object of the present invention to provide a method for forming a good dielectric over polysilicon without requiring thermal oxide growth on the polysilicon.

A dynamic RAM cell having capacitative storage in a polysilicon-to-polysilicon capacitor is disclosed in M. Koyanagi et al. "Novel High Density, Stacked Capacitor MOS RAM," Jap. Jour. Appl. Phys. Pages 18, 35 (1978), which is hereby incorporated by reference. A more recent publication which also shows an upper storage capacitor in a DRAM structure is found in K. Ohta et al, "Quadruple Self-Aligned Stacked High-Capacitance RAM Using $Ta_2O_5$ High-Density VLSI Dynamic Memory," IEEE Transactions on Electron Devices, Volume ED 29; Page 368 (1982) which is hereby incorporated by reference.

In addition, the use of composite dielectrics at some point in a DRAM cell is believed to be generally known. However, no known DRAM cell uses a composite dielectric over polysilicon. In particular, no DRAM cell uses a composite dielectric over silicon for a storage capacitor.

The multi-dielectric stack used in the present invention is much like the multi-dielectric stacks also used in the prior art of multi-dielectric memory cells. However, in the present invention, the semiconductor on both sides of the stack is heavily doped. Where light doping levels are used, trapped charge within the dielectric stack can be sensed, but with heavy doping levels the operation of the device is quite insensitive to trapped charge, as is desirable in DRAM cells.

A difficulty of pure nitride films for capacitor to capacitor dielectric is that the nitride readily accepts trapped charge. This means that the threshold voltage across the dielectric stack will shift with the operating history of the array, and eventually the same write voltage on the common electrode of a number of capacitors will produce widely varying voltages on the respective second electrodes of capacitors, so that in effect the set of capacitors will come to have apparently widely varying capacitances.

This sensitivty to the threshold voltage is minimized by having a high doping density in both electrodes of the capacitor.

In the art of analog circuits, a common technique for producing precision polysilicon to polysilicon capacitors is to lightly dope the first level of polysilicon (bottom plate) to 100 ohms/sq, so a uniform and reasonably thin dielectric can be grown at the same time the gate oxide is regrown. Second level polysilicon is then used as the top plate. However, this means that the lower polysilicon level cannot be used for interconnects.

The present invention teaches a technique for fabricating polysilicon to polysilicon capacitors with a high capacitance/unit area, e.g. 0.8 pF/mil$^2$. The technique utilizes a composite oxide/nitride/oxide dielectric whose thickness is controlled independently of the regrown gate oxide, without the requirement of an extra mask. The composite dielectric has very good integrity, typical breakdown for a 100 A equivalent layer is around 10. In some of the test experiments the oxide and nitride layers were formed by low pressure chemical vapor deposition (LPCVD). These have exhibited high uniformity, better than 0.005%/mil or 3% across a 3" slice. A further advantage of using an LPCVD dielectric is that polysilicon 1 can be doped to about 15 ohms per square since it is no longer necessary to thermally grow a uniform oxide. This gives the designer the flexibility of using both heavy doped 1st polysilicon and silicided 2nd polysilicon for interconnect.

Thus it is an object of the present invention to provide a method for fabricating capacitors having high specific capacitance for integrated circuits.

It is a further object of the present invention to provide a method for fabricating capacitors having high specific capacitance in a standard MOS process.

Forming a precision capacitor over a first polysilicon level is particularly difficult, since the surface of the first polysilicon level will normally not be as smooth as that of a monocrystalline polished semiconductor surface, that is, the surface of even good polysilicon will normally have a certain amount of unevenness. This unevenness can significantly affect the thickness of an oxide which is formed over the polysilicon. It not only leads to uncertainty in the average specific capacitance, but also can cause formation of areas where an oxide grown over polysilicon is locally thin.

Thus it is a further object of the present invention to provide a method for reliable fabrication of uniform dielectrics over a polysilicon level. The roughness of the polysilicon surface means that pinholing through a dielectric grown over first poly can occur. This problem becomes particularly serious if the dielectric is a thin one, as is required for high specific capacitance. This is a major concern in large analog integrated circuits, since the large total area devoted to capacitors means that even a small density of capacitor pinholes can cause drastic yield degradation.

Thus it is a further object of the present invention to provide a thin polysilicon-to-polysilicon dielectric having a very low density of pinholes.

In double poly processes, a regrown gate oxide is normally used to form transistors having second poly gates. That is, after the first polysilicon level has been completely formed, the areas where transistors and second polysilicon are to be formed are cleared down to silicon, and the gate oxides for second polysilicon transistors are grown from scratch. However, the oxidizing conditions which permit growth of the second gate oxide also promote growth of oxide over the first polysilicon level. Moreover, oxide normally grows faster on doped polysilicon than on crystalline silicon under the same conditions, so that a thicker oxide will be formed over the first polysilicon level. Where the oxide has already been formed over the first polysilicon level before growth of the second gate oxide, as is typical, the oxide thickness over the first polysilicon will be increased by the oxidizing conditions.

The second gate oxide will of course normally be grown to a precisely controlled thickness, but the simultaneous thickness increase of the oxide over the first polysilicon may not be adequately controlled. The chief reason for this is because of doping uncertainty. The oxidizing rate is a function of the polysilicon doping level, and the doping level itself cannot be precisely controlled in highly conductive POCl$_3$-doped polysilicon. Even if the polysilicon doping is performed by ion implantation, the average doping level in polysilicon will still be sensitive to the thickness of the polysilicon level deposited, which is also normally not a parameter which can be precisely controlled.

Thus it is an object of the present invention to provide a method for growth of a second gate oxide without any uncontrolled change in the thickness of an existing oxide over a first polysilicon level.

Thus it is an object of the present invention to provide a method for growth of a second gate oxide without simultaneously growing a thick oxide over first poly.

It is a further object of the present invention to provide a method for growing a second gate oxide without increasing the thickness of a dielectric over a first polysilicon level.

A further problem with formation of capacitors is uniformity of the specific capacitance across the wafer. This problem is most acute in data conversion circuits where nonuniformity of capacitors can sacrifice several bits of accuracy. If integrated data conversion circuits are to have performance competitive with custom-trimmed hybrid circuits, uniform specific capacitance is a must. This is also a problem with switched-capacitor filtering, where nonuniformity can substantially degrade filter characteristics.

Thus it is a further object of the present invention to provide a method for forming polysilicon-to-polysilicon capacitors with highly uniform specific capacitance across the wafer.

In the present invention a composite oxide/nitride oxide dielectric is used over the first polysilicon level, instead of the thermal oxide taught by the prior art. This means that very thin dielectrics can be used over first polysilicon which have very high dielectric integrity (low level of pinholes) and very high dielectric strength (breakdown voltage). Moreover, the dielectrics formed by the present invention are virtually unaffected by the normal second gate oxide growth cycle, so that the problem of uncontrolled thickness increase vanishes.

BRIEF DESCRIPTION OF THE DRAWING

The present invention will be described with reference to the accompanying drawings, wherein:

FIGS. 1 and 2 show examples of DRAM cells formed according to the present invention;

FIG. 3 shows the presently preferred embodiment of a DRAM cell according to the present invention;

FIG. 4 shows a further embodiment of a DRAM cell according to the invention, wherein both an upper storage capacitor and a substrate capacitor store charge;

FIG. 6 is an enlarged view of the encircled portion of FIG. 1.

DESCRIPTION OF THE PREFERRED EMBODIMENTS

Figure 5:
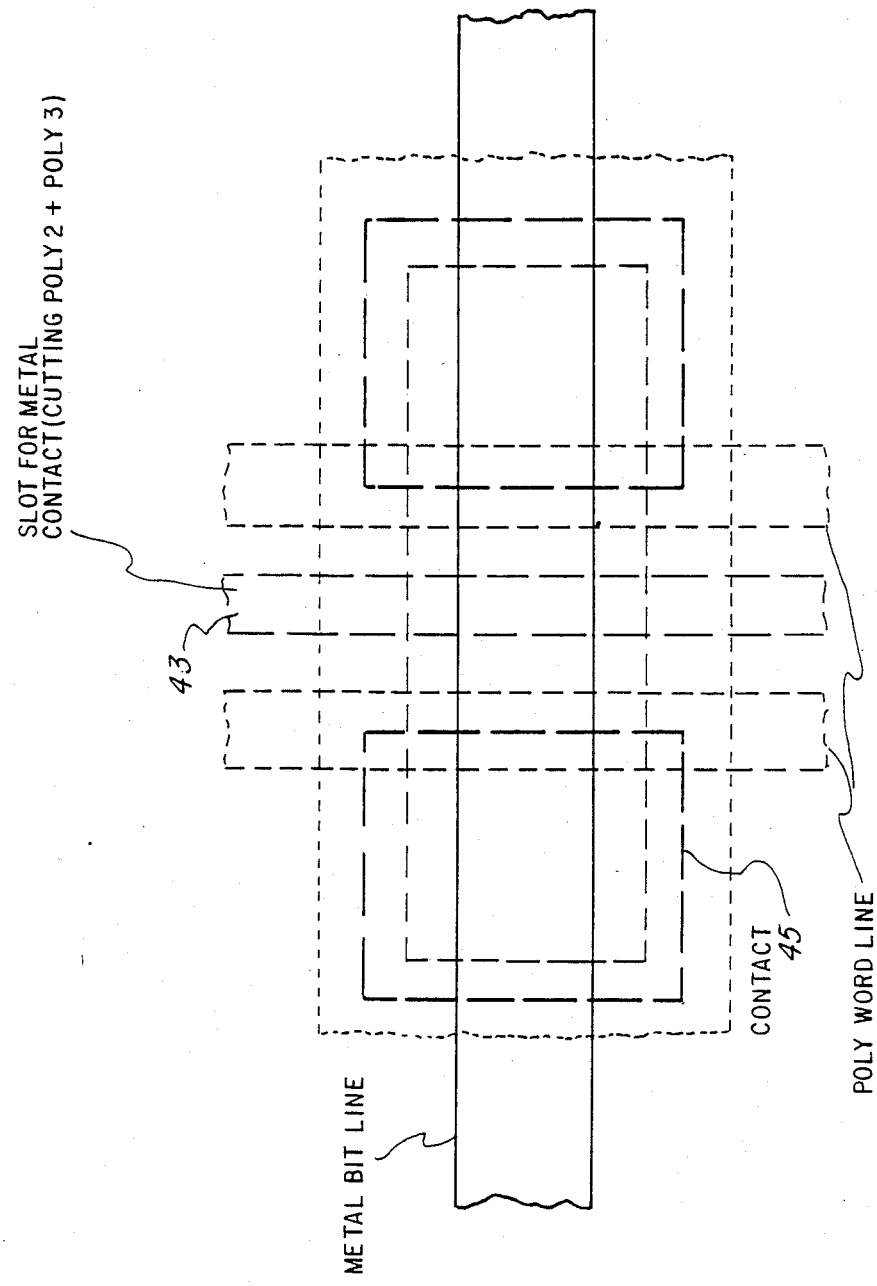
FIG. 5 shows a plan view of the cell layout of FIG. 3.

A novel technique is provided for forming high value novel polysilicon to polysilicon capacitors for DRAM storage capacitors. High specific capacitance in a DRAM is important for minimizing cell area while maintaining a large value of stored charge. In any DRAM design that utilizes double or triple polysilicon the technique described can be applied.

In the mainstream of DRAM prior art the storage capacitor is formed between the first polysilicon storage gate and the substrate. It is usual practice to use the second level of polysilicon, now polysilicon/silicide composite in VLSI design, for interconnects and for the transfer gates, i.e. the gate which is regrown.

The present invention teaches two kinds of modifications to the storage capacitor. In all embodiments, an upper storage capacitor is formed over a polysilicon (or silicide,) level. Preferably, this is formed between the second and third polysilicon levels, so the storage capacitor can extend over the transfer gate and part of the field oxide. This means that essentially all of the cell area is storage capacitor area. This has the important advantage that pressure on the transfer gate lithography is removed. That is, at present the area of the storage capacitor is almost impossible to reduce, due to the minimum charge-storing requirements discussed. Thus, the only part of the cell which can be upgraded is the transfer gate, interconnects, and isolation. By contrast, the present invention removes lithography pressure from these areas, so that a long-channel transfer gate can be used. This eased lithography is itself desirable (simpler processing means higher yield), and the long-channel transfer gate has the further advantage of better isolation of the storage capacitor (better subthreshold behavior in the transfer gate).

In addition, a true stacked capacitor can be used, as shown, e.g., in FIG. 4. However, this imposes difficulties in connecting the substrate storage well to the corresponding polysilicon capacitor plate.

FIGS. 1 and 2 show samples of two kinds of DRAM cells which can be fabricated according to the present invention. FIG. 1 shows a double level polysilicon cell, in which a bridge implant 12 is used to connect the channel of the transistor under the transfer gate 14 to the depletion region 16 underneath the first polysilicon. The storage gate 18 is capacitively coupled both to the depletion region 16 in the substrate, and also to a second polysilicon (polysilicon/silicide composite) level 24. The dielectric 21 between the first polysilicon storage gate 18 and the polycide layer 24 is formed according to the present invention, as described below. However, this embodiment requires independent first poly routings, which is tremendously inconvenient.

FIG. 2 shows a second sample of a DRAM cell made using the present invention, in a triple polysilicon process. In this case, the bridge implant 12 is omitted, so the channel region under the transfer gate 15 connects directly to the depletion well 16. In this case, since the transfer gate must overlap the first polysilicon storage gate 24, the transfer gate 15 is preferably made in the second polysilicon layer. In this embodiment, the top plate 32 is then preferably made in the third polysilicon (polysilicon/silicide composite) layer since this simplifies the problem of the second polysilicon transfer gate 15 shorting to the top capacitor plate 32. However, it is not strictly necessary that this top capacitor plate be made in polysilicon, polysilicon/silicide composite or silicide. One key advantage of the present invention stems from the quality of the dielectric stack 21, regardless of the top plate material. However, it is particularly advantageous to use the present invention where the top plate is also a material which is being used for transistor gates, since this means that the regrown gate oxide for the level in which the top plates are formed (third polysilicon or whatever) can be formed simultaneously with the dielectric stack 21, as discussed above.

FIG. 3 shows the preferred embodiment of a DRAM cell formed according to the present invention. The word lines are shown formed in first polysilicon, but alternatively metal could be used at this level instead. The key aspect of the present invention is seen in the second polysilicon level 41 and the dielectric stack 21 over the second polysilicon level. The second polysilicon level 41 is preferably dedicated entirely to the lower plate of the storage capacitor, but can also be used for interconnects and/or gates. The storage dielectric is formed over the second polysilicon plate, preferably simultaneously with regrowth of gate oxides for transistors to be formed using third polysilicon gates. FIG. 5 shows a plan view of two cells as shown in FIG. 3. In FIG. 5, the polysilicon three common store electrode is not separately shown, since it is simply coextensive over the entire array, except where interrupted by the metal contact slot 43 and by a possible second metal contact. (A second metal contact is preferably used, unless the first polysilicon word line is metal, to distribute the first polysilicon word line. Otherwise the time constant of even a polysilicon/silicide composite or silicide word line is too slow.)

In this embodiment, most of the capacitance is the capacitance between the second polysilicon bottom plate and the third polysilicon common store electrode. There will also be a certain amount of depletion capacitance in the substrate, but the polysilicon-to-polysilicon capacitor is substantially larger. Note that the storage capacitor overlies the transfer gate, as discussed above.

FIG. 4 shows a further stacked capacitor embodiment Note that an additional isolation 47 is required to separate the node 12 addressed by the transfer gate from the high capacitance implant 49.

The remaining features of these cells, and their formation, are prior art. For example, these drawings show cells formed in a LOCOS process, having tapered field oxide regions 33, overlying channel stops 35, but this of course is not strictly necessary, since the present invention can be embodied in other isolation technologies. Similarly, formation of the bit line 37, word line 39, and the array layout and sense amplifier design are entirely conventional and are not modified in the present invention.

The formation of the dielectric stack 21 over a polysilicon storage gate forms the key innovation in the present invention. This step will now be described in great detail.

The key process steps which permit realization of the thin dielectric according to the present invention are as follows:

After the first gate oxide has been grown, the first level 14 (FIG. 1) of polysilicon is deposited and doped with a phosphorus implant of, e.g., $5 \times 10^{15}$ ions per square centimeter.

A thin layer of low pressure CVD silicon dioxide is now deposited (or alternatively thermally grown) to a thickness of 30 angstroms. Next, about 120 angstroms of low pressure CVD silicon nitride 43 is deposited.

The prior art has frequently used thermally grown oxides over first polysilicon levels. However, the difficulty in this case is that, if a good thermal oxide is to be grown over a first polysilicon level, the first polysilicon level must have a relatively low doping. That is, the conductivity of the first polysilicon level in this case cannot be made much less than about 100 ohms per square, means that the first polysilicon level is useless for interconnects. However, if a deposited oxide is used over the first polysilicon level, the first polysilicon level can be highly doped. The chief question would appear to be whether the deposited oxide can be deposited with sufficient uniformity. This has been found to be the case.

In one embodiment of the present invention, deposition and/or oxidation is accomplished by a single-reactor multi-dielectric deposition process. The preferred embodiment of this process will now be described in detail.

Preferably a tube reactor is used to deposit low pressure CVD films of nitride and oxide, and optionally also to deposition polysilicon and to perform oxidation. The key feature is that the reactor is kept at the same temperature during all of the various deposition phases applied. This is critical. The available precision of furnace control will naturally impose limits on the exact constancy of temperature which can be achieved, but it is preferable that the amount of thermal cycling of the deposition furnace to be kept to an absolute minimum. Thermal cycling will tend to release particulates, which is a crucial hazard in any chemical deposition process. In particular, the release of particulates is a particular hazard where nitride is being deposited.

All depositions are LPCVD processes. The preferred oxide deposition is not a standard process, since the process parameters have been adjusted so that the oxide deposition can be performed at the same temperature (800° C. in this embodiment) as the other deposition and oxidizing steps. For oxide deposition, the flow rate used in the presently preferred embodiment is 30 sccm of dichlorosiline and 150 sccm of nitrous oxide, at a total pressure of 500 millitorr. The total pressure can be regulated, for example, by a pump purge of pure nitrogen, which is throttled to keep the tube pressure up to the desired level.

The preferred nitride deposition parameters use the standard Thermco process. That is, 30 sccm of dichlorosilane and 90 sccm of ammonia are flowed at a total pressure of 130 millitorr. Again, the temperature is 800° C.

To perform oxidation, a pure oxygen atmosphere is used, again at the same temperature as the other processing steps in the same reactor (800° C.). At present, due to pump constraints, it is preferred that the oxygen pressure be kept below 150 torr, but this is not a strictly necessary limitation.

Polysilicon can also be grown in the same reactor, without removing the slice from the reactor. The preferred process parameters for polysilicon deposition are 30 sccm of dichlorosiline at a total pressure of 170 millitorr net 800° C. (In the present mode of operation, a nitrogen purge is varied to adjust the pressure as desired.)

Thus, any of these four process steps can be applied in any sequential combination, without removing the slice from the reactor. This provides major advantages in VLSI processing, of several kinds. First, in any deposition reactor, every load operation imposes a risk of particulates being dislodged from the carrier or furnace lock. Secondly, every time a slice is exposed to the air, even in a clean room, a substantial risk of particulate matter suffering electrostatic binding to the slice, and particularly to insulating areas on the slice, is incurred. Third, handling damage risks are of course reduced when no handling is used between furnace steps:

As is well known in the art of furnace deposition, it is normally necessary to clean deposited matter off the furnace walls periodically, e.g. by wet etching.

The furnace used is preferably a hot wall furnace, i.e. a tube which is heated by resistance heaters outside of the tube. However, a susceptor-heated furnace or other furnace could alternatively be used. Thus, the present invention can be practiced (although this is not the most preferred embodiment) by, after the first polysilicon level is in place and patterned, applying an oxide layer, applying a nitride layer, applying an oxidizing ambient to partially reoxidize the nitride layer, and then applying a second poly layer. All of these steps could be performed sequentially without removing the slice from the reactor or maneuvering it at all. It is only after the second polysilicon layer has been deposited that the slice must be removed for doping and etching of the second polysilicon layer.

In an alternative embodiment of the invention, a three layer dielectric stack is applied prior to the reoxidation step. That is, an oxide layer is deposited (or grown), a nitride layer is deposited on the oxide layer, and then another oxide layer is deposited on the nitride layer, prior to the oxidizing step which forms the second gate oxide. Slight additional oxidation of the nitride may take place during the gate oxide regrowth step, but this depends on the thickness of the top oxide. In one embodiment of the invention, a 30 angstrom layer of oxide is grown, followed by 100 angstrom layer of nitride, followed by 30 angstrom layer of oxide. In this case, slight oxidation of the nitride will typically take place when the second gate oxide is grown (e.g. a few angstroms of the nitride will be oxidized) This embodiment provides even further resistance to dielectric thickness increase and even better integrity, but at the cost of somewhat greater process complexity.

The second gate oxide is grown to a thickness of, e.g., 200 angstroms. This at the same time partially oxidizes the 100 angstrom silicon nitride layer 43 over the grown or deposited oxide layer 41 (FIG. 6). However, the nitride oxidation is a self-limiting process, and only a few angstroms of oxide 45 forms on top of the nitride layer 43. This tends to plug up any pinholes in the thin nitride layer 43

The layer of oxide 45 is not only quite thin, but it is also not truly separated from the nitride layer 43. That is, a region of graded oxide/nitride composition will exist instead of a sharp boundary, and for this reason the oxide layer 45 is not shown separately in the Figures. That is, it is more correct to refer to a composite layer 21 than to separate layers 43 and 45.

This is a major source of the advantage of the present invention, in that, not only are the nitride pinholes out of alignment with the underlying oxide pinholes, but also the nitride pinholes themselves tend to be plugged by the reoxidation step.

Because silicon nitride has a higher dielectric constant than silicon dioxide (approximately 7 vs. 4), a layer of silicon nitride is electrically equivalent to a thinner layer of silicon dioxide. For example, in the presently preferred embodiment, a 70 angstrom layer of silicon nitride has the same approximate electrical thickness as 50 angstroms of silicon dioxide, so that the total equivalent thickness of the dielectric layer formed is equivalent to about 100 angstroms of silicon dioxide. This permits the formation of polysilicon capacitors with a specific capacitance in the neighborhood of 0.8 picofarads per square mil.

It should be noted that the uniformity of specific capacitance across the wafer is strongly dependent on the uniformity of the silicon nitride layer. However, low pressure chemical vapor deposition has been found to give excellent uniformity for thin nitride layers.

It should be noted that, although formation of capacitors between two polysilicon levels has been primarily referred to, this is not strictly necessary. For example, the dielectric according to the present invention can easily be formed between a first polysilicon layer and a polysilicon/silicide composite (i.e. polysilicon/silicide composite), pure silicate, or metal top layer.

Moreover, it is also possible to form a thin uniform capacitor dielectric according to the present invention over a polysilicon/silicide composite or pure silicide first layer, although this is not the preferred embodiment of the invention. In this case, the oxide and nitride dielectric layers would both preferably be deposited. With silicide or polysilicon/silicide composite, as with polysilicon, the surface of the silicide layer will normally be uneven. Thus, the same difficulties caused by physical excursion exists with silicide or polycide as exists with polysilicon. Moreover, in silicide and polysilicon/silicide composite as in polysilicon, a significant fraction of dopant impurities will normally be included in the material, and these impurities which are uncontrolled will also affect the oxidation rate of the first plate material in an uncontrolled manner. Most silicides are susceptible to partial oxidation (nuisance oxidation) during the oxidizing conditions which are used to form the second gate oxide, and therefore the present invention is useful to avoid growth of an uncontrolled thickness of silicon and metal oxides over a silicide bottom layer.

As will be obvious to those skilled in the art, the present invention provides a process innovation having very wide applicability, and can be practiced in the context of a very wide variety of integrated circuit processes, and with a very wide variety of modifications and variations. The scope of the claimed invention is therefore not limited except as specified in the accompanying claims.

What is claimed is:

1. An integrated circuit including an array of memory cells, comprising:
   (a) a monocrystalline substrate,
   (b) a field oxide formed on said substrate defining said array of memory cells,
   (c) each memory cell having:
      (i) a pair of spaced implanted regions disposed in said substrate,
      (ii) a gate electrode spaced from said substrate,
      (iii) a first capacitor electrode on said substrate contacting one of said implanted regions and extending over and spaced from said gate electrode and over a portion of said field oxide, and
   (d) a second capacitor electrode extending substantially over said array, said gate electrode and said first capacitor electrode and spaced therefrom and extending over said field oxide beyond said first capacitor electrode.

2. A circuit as set forth in claim 1 further including a dielectric layer between said substrate and said gate electrode.

3. A circuit as set forth in claim 2 wherein said gate electrode is formed from polysilicon.

4. A circuit as set forth in claim 2 wherein said capacitor electrode is formed from polysilicon.

5. A circuit as set forth in claim 3 wherein said capacitor electrode is formed from polysilicon.

6. A circuit as set forth in claim 1 wherein said dielectric extending over said first capacitor electrode is formed of a layer of silicon oxide, a region of silicon nitride thereover and then a layer of silicon oxide.

7. A circuit as set forth in claim 5 wherein said dielectric extending over said first capacitor electrode is formed of a layer of silicon oxide, a region of silicon nitride thereover and then a layer of silicon oxide.

8. A circuit as set forth in claim 1 wherein said gate electrode extends over both said implanted regions.

9. A circuit as set forth in claim 1 further including a dielectric layer between said first and second capacitor electrodes.

10. A circuit as set forth in claim 9 wherein said dielectric includes at least layers of different materials.

11. A circuit as set forth in claim 10 wherein at least one of said layers is an oxide.

12. A circuit as set forth in claim 10 wherein at least one of said layers is a nitride.

13. A circuit as set forth in claim 11 wherein at least one of said layers is a nitride.

* * * * *